(12) United States Patent
Chou et al.

(10) Patent No.: US 12,142,514 B2
(45) Date of Patent: Nov. 12, 2024

(54) CLAMP RING AND METHOD OF USING CLAMP RING

(71) Applicant: Taiwan Semiconductor Manufacturing Co., Ltd., Hsinchu (TW)

(72) Inventors: Chih-Wei Chou, Hsinchu (TW); Yuan-Hsin Chi, Hsinchu (TW); Yin-Tun Chou, Hsinchu (TW); Hung-Chih Wang, Hsinchu (TW); Yu-Chi Liu, Hsinchu (TW); Chih-Ming Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 552 days.

(21) Appl. No.: 17/459,827

(22) Filed: Aug. 27, 2021

(65) Prior Publication Data

US 2023/0068139 A1    Mar. 2, 2023

(51) Int. Cl.
*H01L 21/687* (2006.01)
*H01L 21/285* (2006.01)
*H01L 21/768* (2006.01)

(52) U.S. Cl.
CPC .... *H01L 21/68721* (2013.01); *H01L 21/2855* (2013.01); *H01L 21/68735* (2013.01); *H01L 21/76895* (2013.01)

(58) Field of Classification Search
CPC . H01L 21/68; H01L 21/682; H01L 21/68721; H01L 21/68735
See application file for complete search history.

(56) References Cited

U.S. PATENT DOCUMENTS

| | | | |
|---|---|---|---|
| 6,171,453 | B1 * | 1/2001 | Chung ............. H01L 21/68721 |
| | | | 204/192.15 |
| 6,582,569 | B1 | 6/2003 | Chiang et al. |
| 10,546,973 | B2 | 1/2020 | Zhu et al. |
| 2003/0196604 | A1 | 10/2003 | Sidhwa |
| 2004/0149226 | A1 | 8/2004 | Chen |
| 2007/0012561 | A1 | 1/2007 | Bichler et al. |
| 2015/0129414 | A1 | 5/2015 | Bih et al. |

FOREIGN PATENT DOCUMENTS

| | | |
|---|---|---|
| CN | 106702342 A | 5/2017 |
| CN | 113284820 A | 8/2021 |
| KR | 20010009882 A | 2/2001 |
| KR | 20090002920 A | 1/2009 |

* cited by examiner

*Primary Examiner* — Tyrone V Hall, Jr.
(74) *Attorney, Agent, or Firm* — Seed IP Law Group LLP

(57) ABSTRACT

A clamp ring including an inner periphery of increased diameter at locations where inwardly extending tabs are not located reduces the risk a workpiece that is placed in close proximity to the clamp ring or which contacts the clamp ring during processing will stick to the clamp ring.

20 Claims, 8 Drawing Sheets

CLAMP RING AND METHOD OF USING CLAMP RING

BACKGROUND

Physical vapor deposition (PVD) is a commonly used process in the fabrication of semiconductor industry. The PVD process is a plasma process performed in a vacuum chamber where a negatively biased sputtering target is exposed to plasma of an inert gas having relatively heavy atoms such as argon (Ar) gas or a gas mixture comprising such inert gas. Bombardment of the sputtering target by ions of the inert gas results in ejection of atoms of the sputtering target material. The ejected atoms accumulate as a deposited film on a substrate placed on a substrate support disposed within the chamber.

In the PVD process, substrates are held in place by components of a process kit. Separating the processed substrates from components of the process kit or other components in the process chamber that come in close proximity or contact with the substrates without damaging the substrates is desired to avoid reducing process yield and having to scrap damaged substrates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
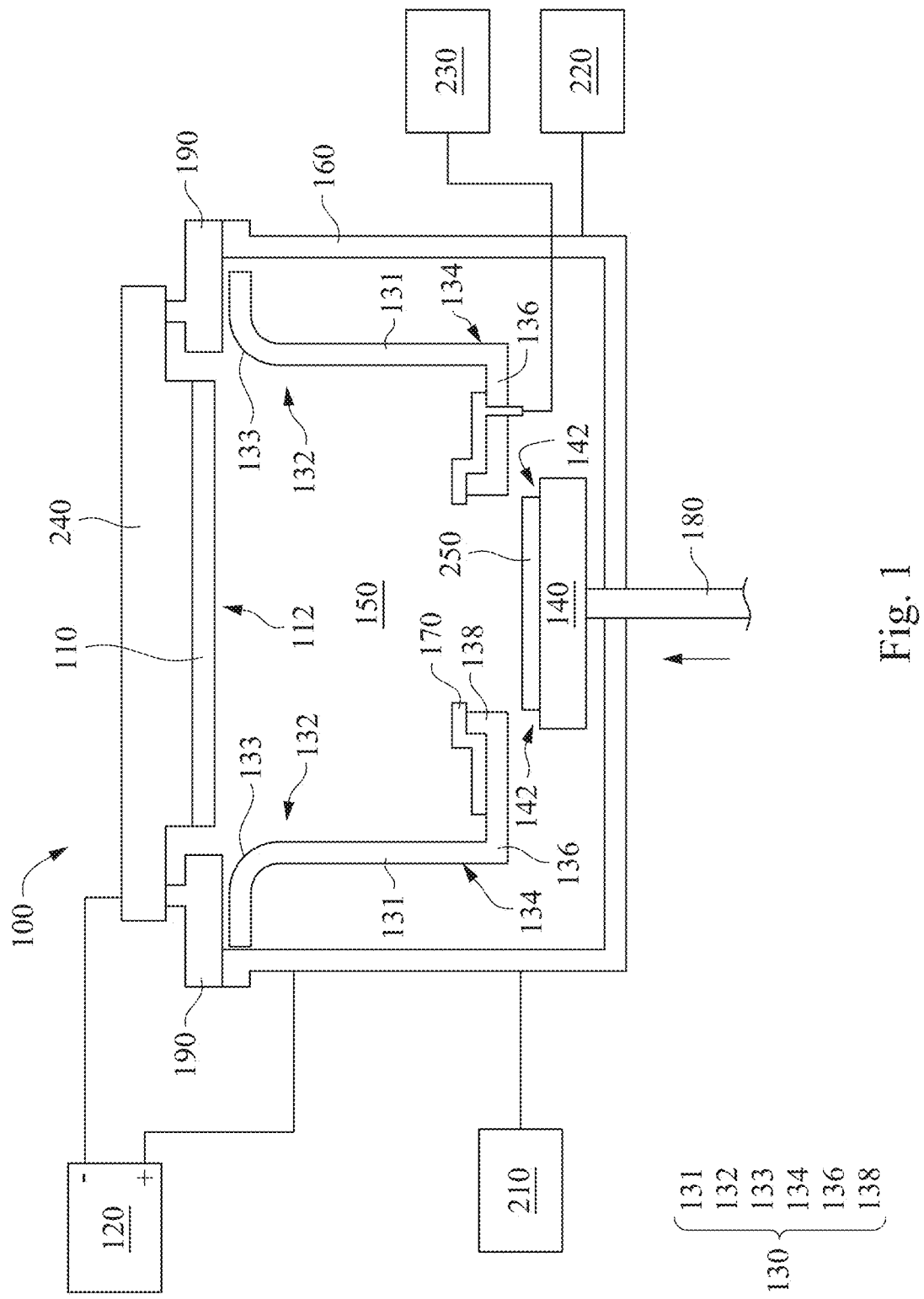
FIG. 1 is a schematic cross-sectional view of a physical vapor deposition chamber.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One embodiment described herein is a clamp ring for use in a deposition chamber for depositing a film on a workpiece, e.g., a physical vapor deposition chamber configured to deposit a film on to a workpiece. The clamp ring is configured to reduce the likelihood that a workpiece will stick to the clamp ring when the workpiece comes in close proximity to the clamp ring or contacts the clamp ring during processing of the workpiece. When a workpiece that has stuck to the clamp ring is separated from the clamp ring, damage can occur to the workpiece or the films deposited thereon. Such damage requires that the workpiece be either reprocessed or scrapped. Reprocessing or scrapping of the workpiece reduces the number of workpieces that the deposition chamber can process per hour. In an embodiment, the clamp ring includes a body having an annular circular shape that includes a topside, a bottom side, an inner periphery having an inner diameter D1 and an outer periphery having an outer diameter D2. The clamp ring also includes a plurality of pads equally spaced around the inner periphery of the body of the clamp ring. Each of the plurality of pads extends radially inward a distance D5 from the inner periphery of the body of the clamp ring. Each of the plurality of pads includes an inner edge closest to the center of the circular clamp ring. The inner edge of a first pad and the inner edge of a second pad that is located 180° from the first pad are spaced apart a distance D4 that is less than inner diameter D1.

Other described embodiments include a system for depositing a film on a workpiece that includes a clamp ring in accordance with one or more embodiments described herein. The clamp ring is provided in a physical vapor deposition chamber. The clamp ring includes a body having an annular circular shape and including a topside, a bottom side, and inner periphery having an inner diameter D1 and an outer periphery having an outer diameter D2. The system further includes a plurality of alignment marks equally spaced around the inner periphery of the body which extend radially inward from the inner periphery of the body. Each of the plurality of alignment marks includes an inner edge. The inner edge of a first alignment mark and the inner edge of a second alignment mark located 180° from the first alignment mark spaced apart a distance D3. The system further includes a plurality of pads equally spaced around the inner periphery of the body with each of the plurality of pads extending radially inward a distance D5 from the inner periphery of the body. Each of the plurality of pads includes an inner edge. The inner edge of a first pad and the inner edge of a second pad located 180° from the first pad spaced apart a distance D4. In accordance with this embodiment, D1 satisfies the equation: D4+2×(D5+X mm), wherein in some embodiments X is greater than 0 mm and in other embodiments X is greater than 0.3 mm.

In another described embodiment, a method of depositing a film onto a workpiece includes providing a deposition chamber including a clamp ring in accordance with one or more embodiments of the present disclosure. The clamp ring includes a body having an annular circular shape and including a topside, a bottom side, and inner periphery having an inner diameter D1 and an inner circumference C1 and an outer periphery having an outer diameter D2. The clamp ring includes a plurality of pads equally spaced around the inner periphery of the body with each of the plurality of pads extending radially inward a distance D5 from the inner periphery of the body and including an inner edge. The inner edge of a first pad and the inner edge of a second pad located 180° from the first pad spaced apart a distance D4 that is less than the inner diameter D1. The method further includes elevating the work piece towards the bottom side of the clamp ring and contacting the workpiece with a portion of the bottom side of the clamp ring making up no more than 25% of C1. The method includes depositing a film onto the workpiece.

FIG. 1 is a simplified block diagram illustrating a PVD chamber for a sputtering deposition process according to various embodiments of the present disclosure. A PVD chamber 100 includes a sputtering target 110, a power supply 120, a process kit 130, and a substrate support 140. As illustrated in FIG. 1, the sputtering target 110 has a sputtering surface 112 that is in contact with a process region 150. The power supply 120 is electrically connected to the sputtering target 110. In various embodiments of the present disclosure, the power supply 120 is a DC supply. For example, the negative electrode of the power supply 120 may be electrically connected to a source 240, and the source 240 is also electrically connected to the sputtering target 110 as shown in FIG. 1. The sputtering target 110 composed of metal or metal alloys which are predetermined to deposit onto a substrate. In various embodiments of the present disclosure, the sputtering target includes titanium (Ti), aluminum (Al) or copper (Cu) or alloys thereof. In other various embodiments of the present disclosure, the sputtering target includes titanium aluminum alloy (TiAl) or an aluminum copper alloy (AlCu).

Referring to FIG. 1, the process kit 130 includes an outer cylindrical band 131, an inner surface 132, a top end 133, a bottom end 134, a base plate 136 and a cylindrical inner band 138. The inner surface 132 at least partially encloses the process region 150. Also as illustrated in FIG. 1, the process kit 130 of the PVD chamber 100 includes a cylindrical outer band 131, a base plate 136, and a cylindrical inner band 138. The cylindrical outer band 131 has a top end 133 and a bottom end 134. The top end 133 is sized to encircle the sputtering surface 112 of the sputtering target 110. The bottom end 134 is sized to surround the substrate support 140. The base plate 136 extends inward from the bottom end 134 of the cylindrical outer band 131. The cylindrical inner band 138 is coupled with the base plate 136 and sized to encircle a peripheral edge 142 of the substrate support 140. The process kit 130 is supported by a chamber body 160 and encircles the sputtering surface 112 of the sputtering target 110 that faces the process region 150 and the substrate support 140. The process kit 130 also surrounds the peripheral edge 142 of the substrate support 140. In other words, an upper portion of the cylindrical outer band 131 surrounds the sputtering surface 112 of the sputtering target 110 and a bottom portion of the cylindrical outer band 131 surrounds the substrate support 140. Also as illustrated in FIG. 1, a U-shaped may be formed by the cylindrical inner band 138, the base plate 136, and the cylindrical outer band 131. In various embodiments of the present disclosure, the cylindrical outer band 131 has a height greater than a height of the cylindrical inner band 138. In other words, the cylindrical inner band 138 has a height that is less than the height of the cylindrical outer band 131. In various embodiments of the present disclosure, the cylindrical outer band, the base plate, and the cylindrical inner band have a unitary structure. For example, the cylindrical outer band, the base plate, and the cylindrical inner band may be made of a single piece of metal as the unitary structure. In various embodiments of the present disclosure, the unitary structure comprises aluminum, stainless steel, or a combination thereof. It is advantageous over prior process kits which include multiple components, often two or three separate pieces to make up the complete process kit. A process kit with multiple components makes it more difficult and laborious to remove the shield for cleaning. In addition, the single piece process kit 130 also more effectively shields the chamber body 160 from sputter deposition during process cycles. In general, the process kit 130 is designed to reduce deposition of sputtering deposits originating from the sputtering surface 112 of the sputtering target 110 onto the components and surfaces behind the process kit 130.

The substrate support 140 has a substrate receiving surface 142. A substrate 250, for example, a wafer is placed on the substrate receiving surface 142 of the substrate support 140 for PVD processes. During the PVD processes, a substrate 250, for example, a wafer is transferred into the PVD chamber 100 and placed on the substrate receiving surface 142 of the substrate support 140. The substrate support 140 is raised towards a covering ring 170 (e.g., a clamp ring) and the process kit 130 to expose the substrate 250 to the process region 150. The substrate support 140 is raised, for example, by a raising mechanism 180. A DC substrate bias source 230 provides a DC bias to the substrate 250, for example, through the covering ring 170 and a line. A gas flow control 210 controls gas flow in and out of the PVD chamber 100. A vacuum pump 220 is used to create a vacuum environment in the PVD chamber 100 during the PVD processes.

As illustrated in FIG. 1, the source 240 is electrically isolated from the process kit 130 and the rest of PVD chamber 100, such as a chamber body 160, by an isolation part 190. The power supply 120 establishes a voltage potential between the sputtering target 110 and other parts, such as the chamber body 160, of the PVD chamber 100. For example, when the substrates 250 are being processed, the negative terminal of the power supply 120 is electrically connected to the sputtering target 110; the positive terminal of the power supply 120 is electrically connected to other parts of the PVD chamber 100. This operating mode is used because gaseous ions from plasma will be accelerated toward whatever surface is connected to the negative terminal of the power supply 120. Thus ions in deposition plasma strike the sputtering target 110, and cause sputtering of metal or metal alloys, for example, titanium or titanium aluminum alloy from the sputtering target 110 to the substrate 250 on the substrate receiving surface 142 of the substrate support 140.

Figure 2:
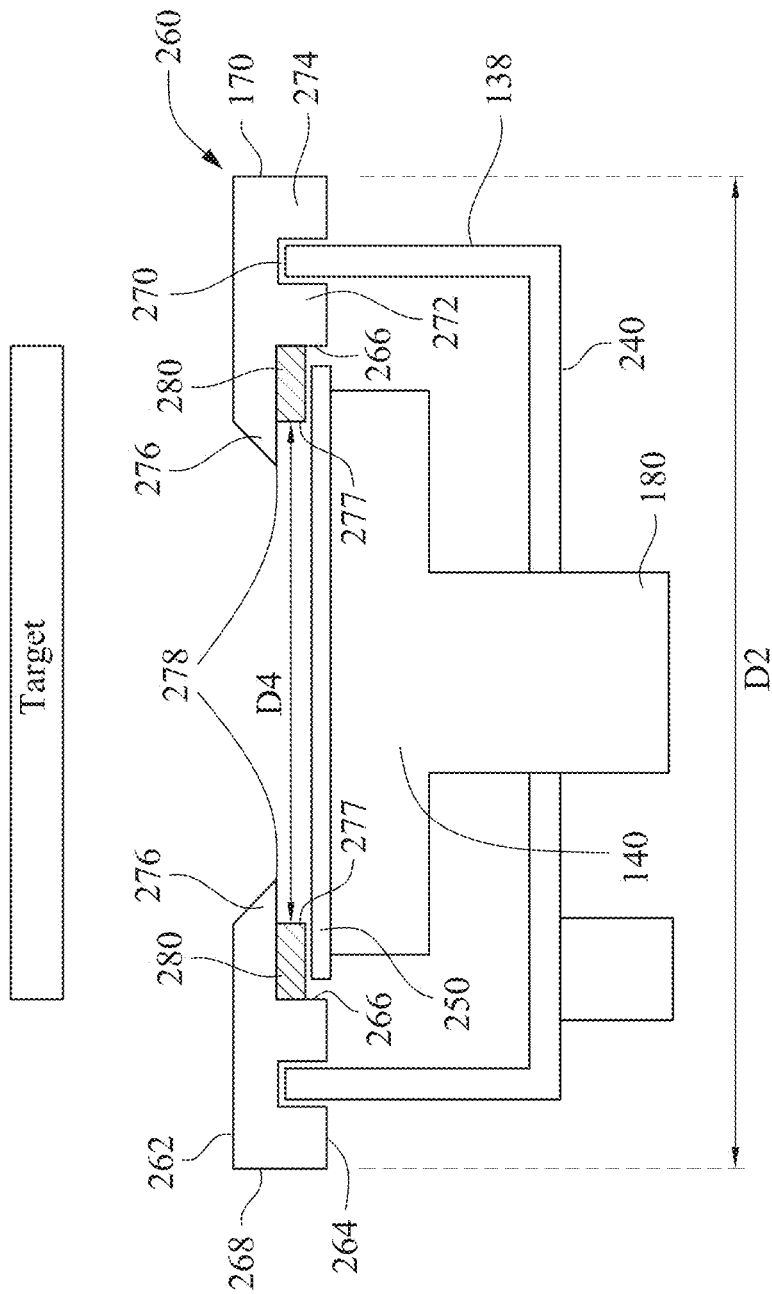
FIG. 2 is a schematic cross-sectional view taken along line 2-2 in FIG. 4A of a portion of a physical vapor deposition chamber in accordance with the present disclosure.
Figure 4A:
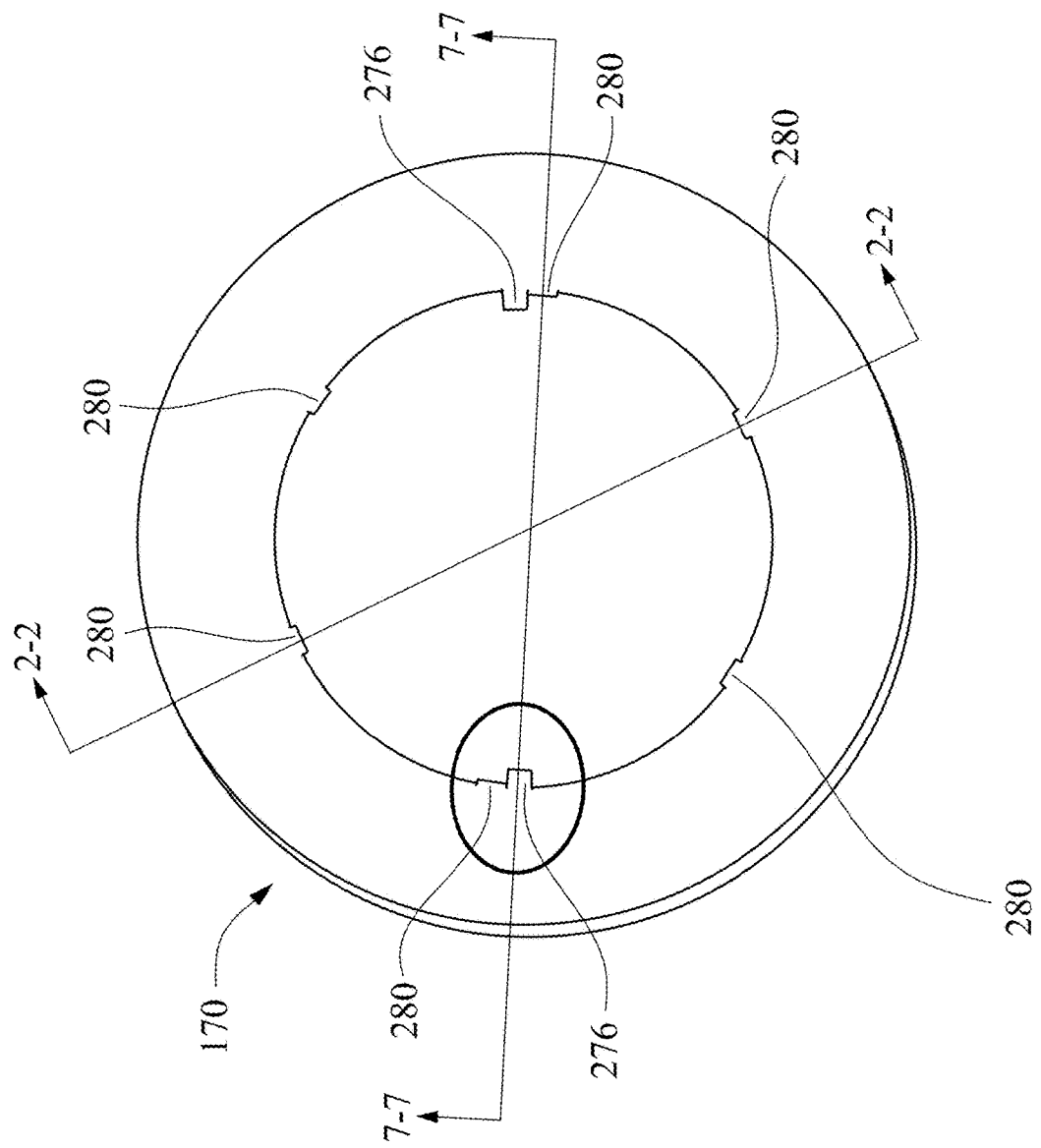
FIG. 4A is a plan view of a top side of a clamp ring in accordance with an embodiment of the present disclosure.

FIG. 2 is a schematic cross-sectional view taken along line 2-2 in FIG. 4A of a portion of the physical vapor deposition chamber. In FIG. 2, the numerals of FIG. 1 are used to identify features in FIG. 1 that are common to FIG.

2. FIG. 2 illustrates a portion of a process kit that includes an inner cylindrical band 138. The inner cylindrical band 138 includes a top end and a bottom end. The bottom end inner cylindrical band 138 is connected to a bottom wall 139 of the process kit. The cross-section of the combination of the inner cylindrical band 138 and the bottom wall 139 is U-shaped. The raising mechanism 180 passes through bottom wall 139. The substrate support 140 is positioned on top of raising mechanism 180. Raising mechanism 180 or substrate support 140 include a source of thermal energy to adjust the temperature of the substrate support 140. In FIG. 2, a substrate or workpiece 250 is positioned on the top of substrate support 140.

Figure 4B:
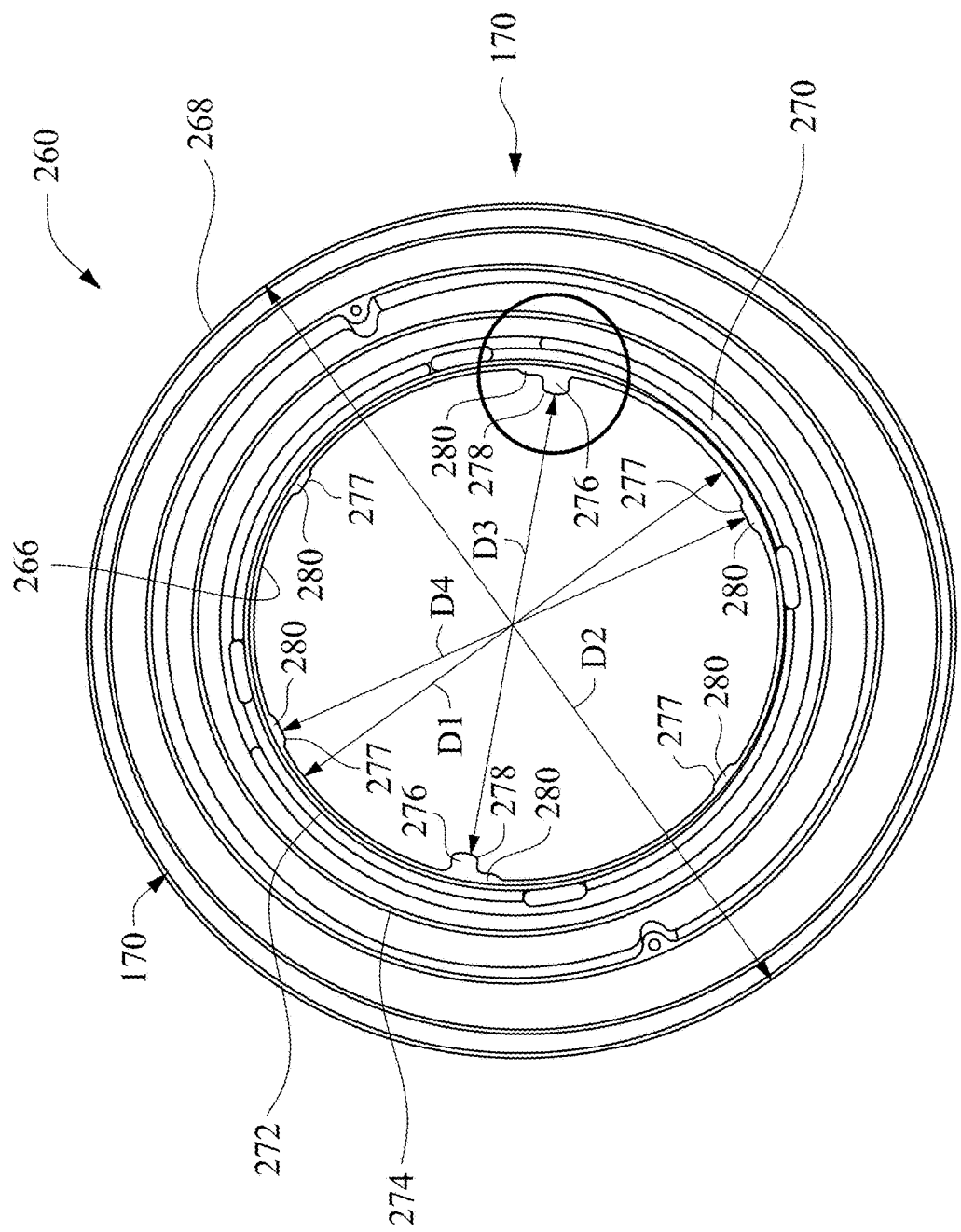
FIG. 4B is a plan view of a bottom side of the clamp ring of FIG. 4A in accordance with an embodiment of the present disclosure.

FIG. 2 also illustrates a cross section of a clamp ring or covering ring 170 in accordance with some embodiments of the present disclosure. FIG. 4A illustrates a plan view of a top of a clamp ring 170 in accordance with an embodiment of the present disclosure and FIG. 4B illustrates a plan view of a bottom of a clamp ring 170 in accordance with an embodiment of the present disclosure. Further details of clamp ring 170 are described below with reference to FIGS. 2, 4A and 4B. In accordance with an embodiment of the present disclosure, clamp ring 170 includes a body 260 having an annular circular shape. Body 260 includes a top side 262, a bottom side 264, an inner periphery 266 and an outer periphery 268. Between inner periphery 266 and outer periphery 268 of clamp ring 170, the underside of clamp ring 170 includes an inner retention ring 272 and an outer retention ring 274. Inner retention ring 272 and outer retention ring 274 are spaced apart from each other and separated by a channel 270. Channel 270 is sized such that the upper end of cylindrical band 138 is received within channel 270. In this manner, clamp ring 170 is supported in the process chamber 160 by the upper end of inner cylindrical band 138.

Extending from an upper portion of the inner periphery 266 of clamp ring 170 along the top side 262 of body 260 are two alignment marks 276. Alignment marks 276 each include an inner edge 278 that defines the inner most edge of alignment marks 276. In some embodiments, the distance that alignment marks 276 extend inward from the inner periphery 266 of clamp ring 170 ranges between about 11 and 9.5 mm. Embodiments in accordance with the present disclosure are not limited to alignment marks 276 that extend inward from the inner periphery 266 about 11 mm to 9.5 mm. In other embodiments of the present disclosure, alignment marks 276 extend inward from the inner periphery 266 of clamp ring 170 a distance that is less than 9.5 mm or a distance that is greater than 11 mm. Embodiments of the present disclosure are not limited to a clamp ring that includes only two alignment marks. Other embodiments of the present disclosure include clamp rings that include more than two alignment marks.

Figure 5:
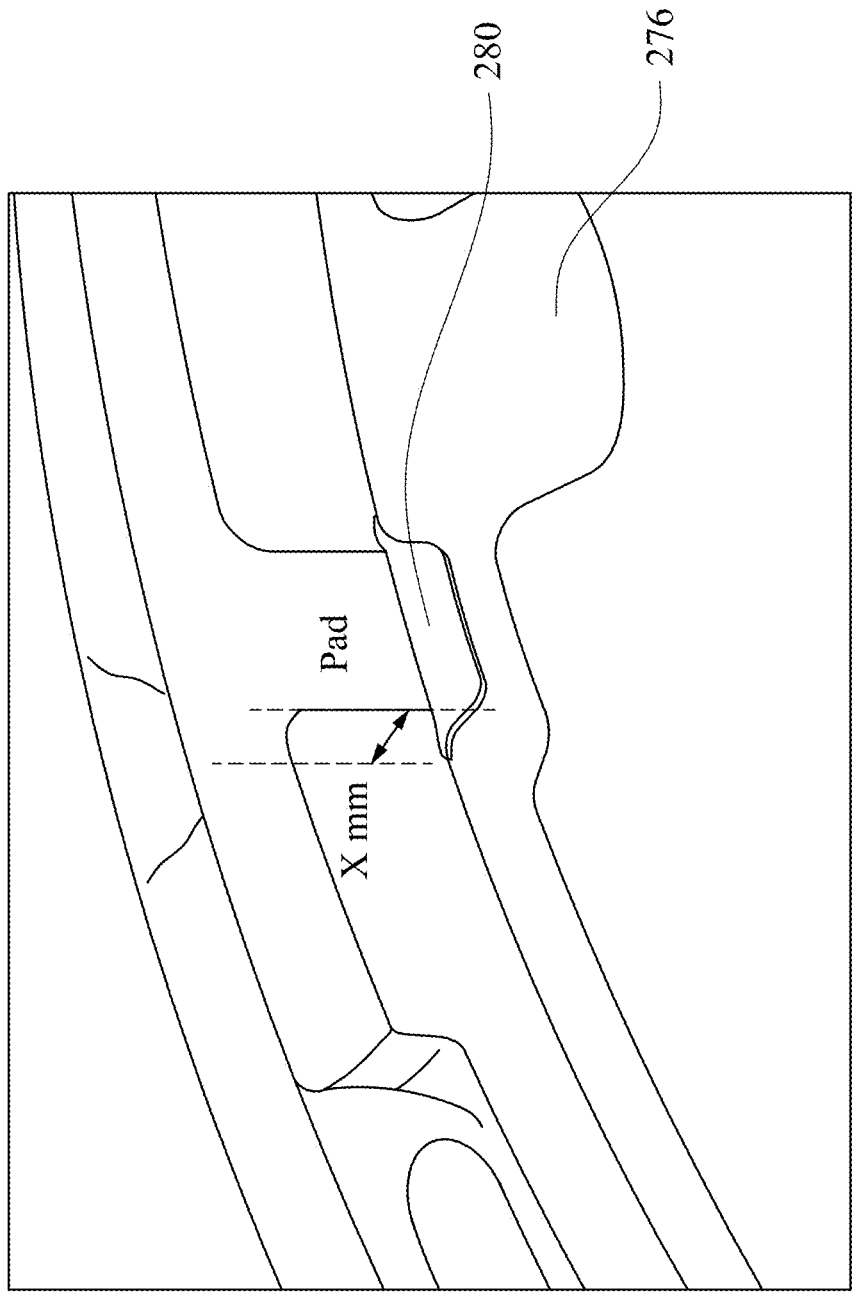
FIG. 5 is an exploded view of the circled portion of the clamp ring illustrated in FIGS. 4A and 4B.

In accordance the illustrated embodiment of the present disclosure, a plurality of pads 280 extend from a portion of the inner periphery 266 of clamp ring 170 that is below the portion of the inner periphery 266 of clamp ring 170 from which the alignment marks 276 extend inwardly. Referring to FIGS. 4A and 4B, pads 280 are located on the inner periphery 266 of clamp ring 170 at locations that are circumferentially offset from the locations of alignment marks 276. Pads 280 do not extend inwardly from inner periphery 266 as far as alignment marks 276 extend inwardly from inner periphery 266 of clamp ring 170. In accordance with some embodiments such as the one illustrated in FIG. 5, pads 280 extend inwardly from the inner periphery 266 of clamp ring 170 by a distance that is greater than about 1.5 mm. In accordance with other embodiments, pads 280 extend inwardly from the inner periphery 266 of clamp ring 170 by a distance that is greater than about 2.5 mm. The distance by which pads 280 extend inwardly from the inner periphery 266 of clamp ring 170 is not limited to being greater than about 1.5 mm or being greater than about 2.5 mm. For example, in accordance with other embodiments, pads 280 extend inwardly from inner periphery 266 of clamp ring 170 by a distance that is less than about 1.5 mm or that is between about 1.5 mm and 2.5 mm. In the clamp ring illustrated in FIGS. 4A and 4B, six pads 280 are present. Embodiments of the present disclosure are not limited to a clamp ring that includes six pads. Other embodiments of clamp rings in accordance with the present disclosure include more than six pads, while yet other embodiments of clamp rings in accordance with the present disclosure include fewer than six pads.

Figure 3:
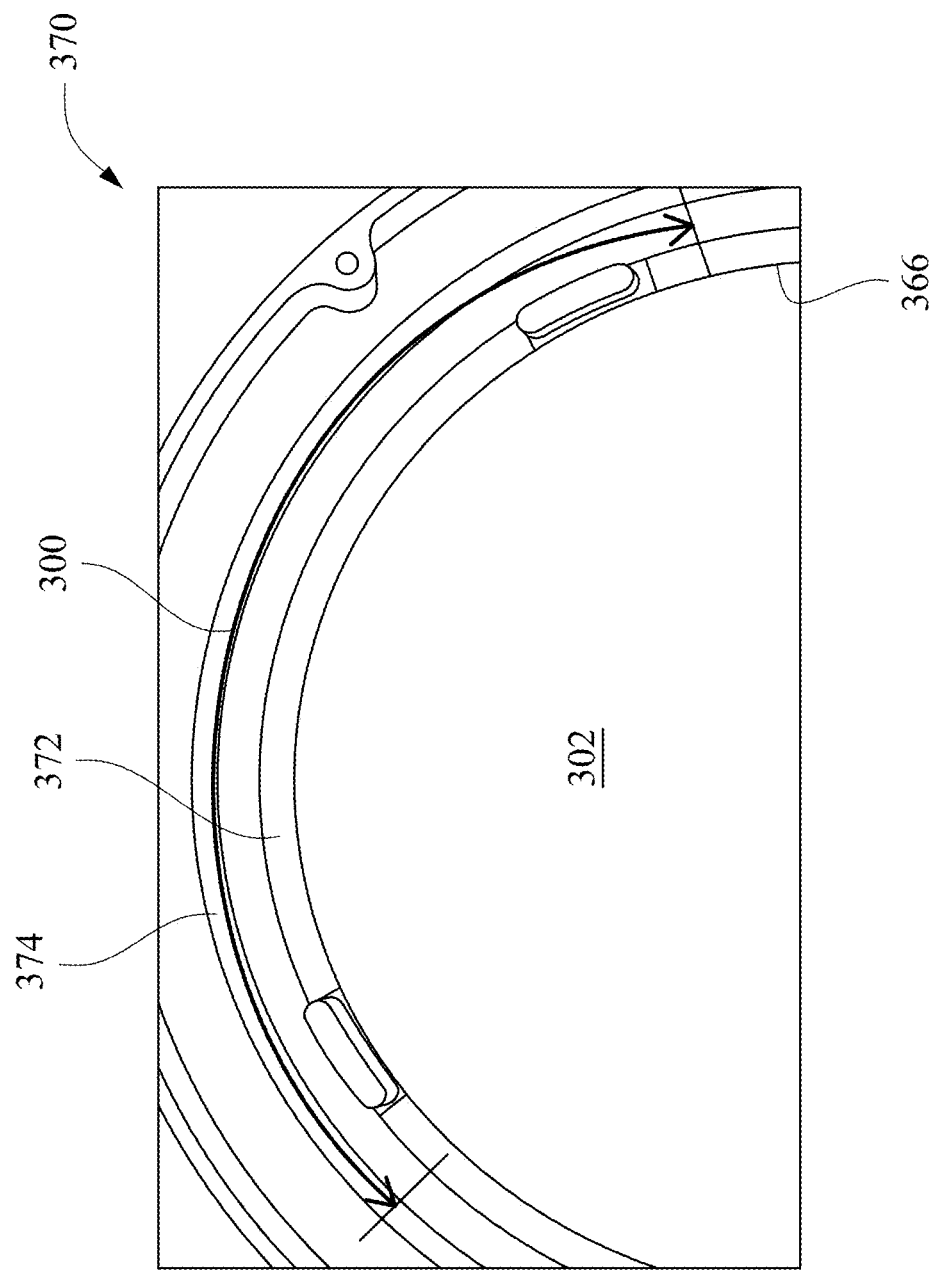
FIG. 3 is a plan view of a bottom of a portion of a clamp ring.

Referring to FIG. 3, a plan view of a bottom of a clamp ring 370 includes arcuate line 300 that identifies the magnitude of a surface of the underside of a clamp ring (which has not been modified in accordance with the present disclosure) that can come into contact with a workpiece when the workpiece is misaligned with a central opening 302 in the clamp ring 370 in FIG. 3 and is brought into proximity of the clamp ring 370 and the deposition process is carried out. Clamp ring 370 is similar to clamp ring 170 of FIGS. 2 and 7 in that it includes an inner periphery 366, an inner retention ring 372 and an outer retention ring 374 that are similar to the inner periphery 266, inner retention ring 272 and outer retention ring 274 of FIG. 2. In FIG. 3, the surface identified by arcuate line 300 is greater than 25% of the circumference of the inner periphery 366 of the clamp ring 370 in FIG. 3. Contact between the workpiece 250 and the clamp ring 370 along such a large portion of the circumference of the inner periphery 366 of the clamp ring is undesirable because it increases the risk that the workpiece will stick to some portion of the clamp ring 370 at the end of the deposition process carried out in the processing chamber. For example, during the deposition process, material may deposit on either the surface of the workpiece 250 where it contacts the clamp ring 370 or the material may deposit on the clamp ring 370 where it contacts the workpiece 250. Even if workpiece 250 does not contact clamp ring 370, it is still possible, that deposited material may bridge any gap between workpiece 250 and clamp ring 370 locations where the two articles proximity to each other. As a result, the workpiece may adhere to or be stuck to the clamp ring. Separating the workpiece from the clamp ring can damage the deposited film or other features on the workpiece. Such damage results in the need to either reprocess the workpiece or scrap the workpiece, both actions that reduce the overall throughput of the processing chamber.

Figure 7:
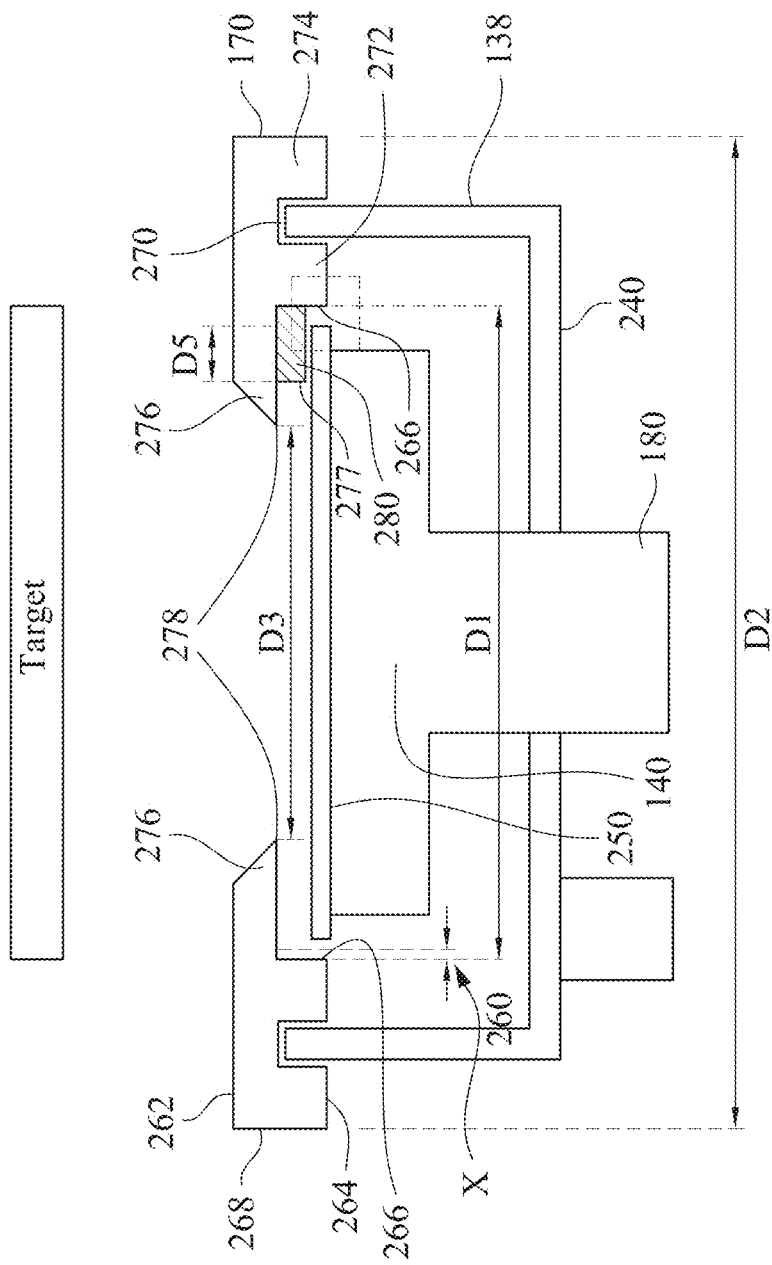
FIG. 7 is a schematic cross-sectional view along line 7-7 in FIG. 4A of a portion of a physical vapor deposition chamber in accordance with an embodiment of the present disclosure.

Referring to FIG. 4B and additionally FIG. 7, a clamp ring 170 in accordance with an embodiment of the present disclosure includes an inner periphery 266 having an inner diameter D1. FIG. 7 is a cross-sectional schematic view of a portion of a physical vapor deposition chamber taken along line 7-7 in FIG. 4A. As seen in FIG. 4A, line 7-7 passes through the center of an alignment mark 276 through the center axis of clamp ring 170 and then through a center of tab 280. In accordance with some embodiments of the present disclosure, D1 is about 100.4% or more of the outer diameter of the workpiece. In other embodiments, D1 is about 100.7% or more of the outer diameter of the workpiece. In other embodiments, D1 is about at least 0.5% greater than the outer diameter of the workpiece. In other embodiments D1 is about at least about 1.0% greater than the outer diameter of the workpiece. In accordance with some embodiments of the present disclosure, where the clamp ring 170 is designed for use in combination with workpiece having an outer diameter of about 200 mm, D1 is greater than about 200.8 mm. In other embodiments of a clamp ring for use in combination with a workpiece having an outer diameter of about 200 mm, D1 is greater than about 201 mm. In other embodiments, for example, clamp rings for use and combination with workpieces having an outer diameter that is not 200 mm, D1 is about 0.5 mm or more greater than the outer diameter of the workpiece. In yet other embodiments, D1 is about 1 mm or more greater than the outer diameter of the workpiece. For example, a clamp ring in accordance with an embodiment of the present disclosure for use in combination with a workpiece having an outer diameter of about 300 mm would have a dimension D1 that is about 301 mm or greater or a dimension D1 that is about 302 mm or greater. Clamp ring 170 also includes an outer periphery 268 having an outer diameter D2, D2 being greater than D1. Between inner periphery 266 and outer periphery 268 are inner retention ring 272 and outer retention ring 274. As described above, inner retention ring 272 and outer retention ring 274 define a groove or channel 270 that receives an upper end of inner cylinder band 138.

Continuing with reference to FIGS. 4B and 7, extending inward from inner periphery 266 of clamp ring 170 are two alignment marks 276. These two alignment marks are spaced 180° from each other around the inner circumference of the inner periphery 266 of clamp ring 170. As described above, each of these alignment marks 276 includes and inner edge 278. The inner edge 278 of one of the alignment marks 276 being separated from the inner edge 278 of the other alignment mark 276 by a distance D3. In some embodiments of the present disclosure, a clamp ring for use in combination with workpieces having an outer diameter, e.g., 200 mm to 300 mm, D3 is about 98.5% to about 98.9% of the outer diameter of the workpiece. Embodiments in accordance with the present disclosure are not limited to clamp rings having a dimension D3 that is about 98.5% to about 98.9% of the outer diameter of the workpiece. Other embodiments of the present disclosure include clamp rings having a dimension D3 that is less than 98.5% of the outer diameter of the workpiece or greater than about 98.9% of the outer diameter of the workpiece. For example for a workpiece having an outer diameter of about 200 mm, D3 is about 197.1 mm to about 197.7 mm. Embodiments in accordance with the present disclosure are not limited to clamp rings having a dimension D3 that is between about 197.1 mm to about 197.7 mm. Other embodiments of the present disclosure include clamp rings that have a dimension D3 that is less than 197.1 mm or that is greater than about 197.7 mm.

Continuing with reference to FIGS. 4B and 7, also extending inward from the inner periphery 266 of clamp ring 170 are a plurality of pads 280. Each of the plurality of pads 280 includes an inner edge 277 that defines the innermost edge of each of the plurality of pads 280. In the illustrated embodiment of FIG. 4B, six pads are illustrated. Adjacent pads 280 of the six pads are spaced apart from each other by 60° around the circumference of the inner periphery 266 of clamp ring 170. In accordance with other embodiments of the present disclosure, the adjacent pads 280 are spaced apart from each other by greater than 60° or less than 60°, depending upon how many pads are present. The inner edge 277 of one pad 280 is spaced apart a distance D4 from the inner edge 277 of another pad located 180° around the inner periphery 266 of clamp ring 170. In some embodiments of the present disclosure, a clamp ring for use in combination with workpieces having an outer diameter, e.g., 200 mm to 300 mm, D4 is about 98.9% or more of the outer diameter of the workpiece. Embodiments in accordance with the present disclosure are not limited to clamp rings having a dimension D4 that is greater than about 98.9% of the outer diameter of the workpiece. Other embodiments of the present disclosure include clamp rings having a dimension D4 that is less than 98.9% of the outer diameter of the workpiece. For example for a workpiece having an outer diameter of about 200 mm, D4 is about 197.8 mm or more. Embodiments in accordance with the present disclosure are not limited to clamp rings having a dimension D4 that is 197.8 mm or more. Other embodiments of the present disclosure include clamp rings that have a dimension D4 that is less than 197.8 mm. In embodiments of a clamp ring for use in combination with a workpiece having an outer diameter of about 300 mm, D4 is about 296.7 mm or more. Embodiments of a clamp ring in accordance with the present disclosure for use in combination with a workpiece having an outer diameter of about 300 mm are not limited to clamp rings having a dimension D4 that is 296.7 mm or more. Other embodiments of a clamp ring for use in combination with a workpiece having an outer diameter of about 300 mm include clamp rings that have a dimension D4 that is less than 296.7 mm.

Continuing with reference to FIG. 7, pads 280 extend from inner periphery 266 of clamp ring 170 a distance identified by dimension D5 in FIG. 7. In accordance with embodiments of the present disclosure, the dimension D1 (i.e., diameter of inner periphery 266 of clamp ring 170) satisfies the following equation:

$$D4+2\times(D5+X \text{ mm}) \text{ where } X \text{ is greater than 0 mm.} \quad \text{(Eqn. 1)}$$

Embodiments in accordance with the present disclosure are not limited to clamp rings having a dimension D1 that satisfies Equation 1. For example, in accordance with other embodiments, dimension D1 satisfies the equation:

$$D4+2\times(D5+X \text{ mm where } X \text{ is 0.3 mm or greater.} \quad \text{(Eqn. 2)}$$

Figure 6:
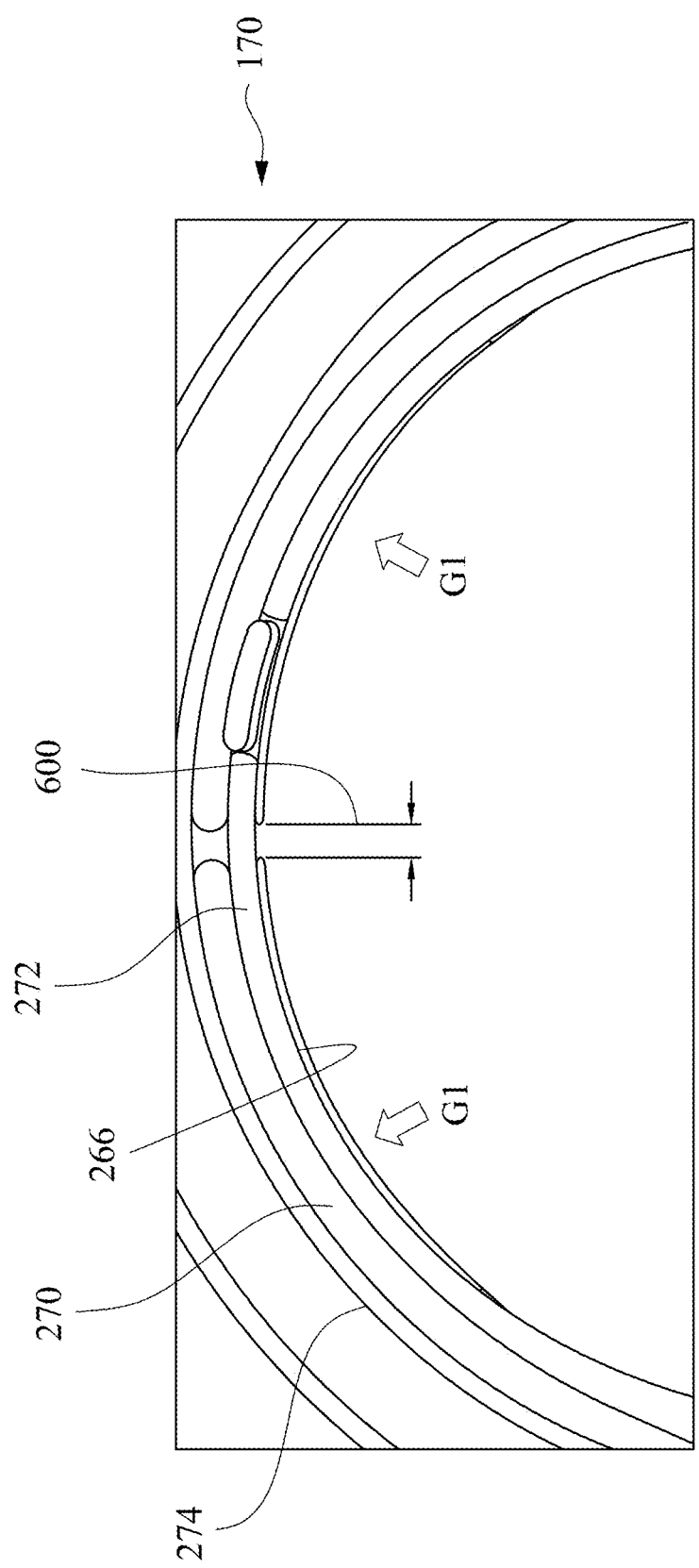
FIG. 6 is a plan view of a bottom side of a portion of a clamp ring in accordance with an embodiment of the present disclosure.

Referring to FIG. 7, an embodiment of a clamp ring 170 in accordance with the present disclosure includes an inner periphery 266 which has an inner diameter D1 at locations where pads 280 are not located that is 2×X mm greater than dimension D4, i.e., distance between inner edges 277 of pads 280. This increased inner diameter D1 reduces the magnitude of the portion of the clamp ring 170 at its inner periphery 266 that can potentially come in contact with the workpiece 250 when workpiece 250 is brought into close proximity of clamp ring 170. Referring to FIG. 6, in accordance with an embodiment of the present disclosure, a portion 600 of the inner periphery of clamp ring 170 that can potentially come in contact with the workpiece is less than about 5% of the circumference C1 at the inner periphery 266 of clamp ring 170. In accordance with embodiments of the present disclosure, the identified gaps present between the workpiece and the inner periphery 266 of clamp ring 170 reduce the risk that the workpiece will stick to the clamp ring. In other embodiments, the portion of the inner periphery of clamp ring 170 that can potentially come in contact with the workpiece is less than about 2.5% of the circumference C1 at the inner periphery 266 of clamp ring 170. In other embodiments, the portion of the inner periphery of clamp ring 170 that can potentially come in contact with the workpiece is less than about 1.0% of the circumference C1 at the inner periphery 266 of clamp ring 170. For embodiments of a clamp ring in accordance with the present invention for use in combination with a workpiece having an outer diameter of about 200 mm, the portion of the inner periphery of clamp ring 170 that can potentially come in contact with the workpiece is less than 10 mm of the circumference C1 at the inner periphery 266 of clamp ring 170. In other embodiments, the portion of the inner periphery of clamp ring 170 that can potentially come in contact with the workpiece is less than about 7.5 mm of the circumference C1 at the inner periphery 266 of clamp ring 170. In other embodiments, the portion of the inner periphery of clamp ring 170 that can potentially come in contact with the workpiece is less than about 6.5 mm of the circumference C1 at the inner periphery 266 of clamp ring 170.

In an embodiment, the present disclosure describes a clamp ring for use in a deposition chamber for depositing a film on a workpiece. The clamp ring includes a body having an annular circular shape and including a topside, a bottom side, and inner periphery having an inner diameter D1 and an outer periphery having an outer diameter D2. The clamp ring includes a plurality of tabs equally spaced around the inner periphery of the body. Each of the plurality of tabs extends radially inward a distance D5 from the inner periphery of the body. Each of the tabs includes an inner edge. The inner edge of a first tab in the inner edge of a second tab located 180° from the first tab around the inner periphery of the clamp ring are spaced apart a distance D4 that is less than D1.

In other embodiments of a clamp ring in accordance with the present disclosure, the clamp ring includes a plurality of alignment marks equally spaced around the inner periphery of the body of the clamp ring. In accordance with such embodiment, each of the plurality of alignment marks extends radially inward from the inner periphery of the body. Each of the plurality of alignment marks includes an inner edge. The inner edge of a first alignment mark and the inner edge of a second alignment mark located 180° from the first alignment mark are spaced apart a distance D3.

In another embodiment of a clamp ring, D1 satisfies the equation:

$D4+2\times(D5+X \text{ mm})$, wherein $X$ is greater than 0 mm.

In another embodiment of a clamp ring, D1 satisfies the equation:

$D4+2\times(D5+X \text{ mm})$, wherein $X$ is 0.3 mm or greater

In another embodiment, a method of depositing a film onto a workpiece is described. The method involves providing a deposition chamber including a clamp ring. The clamp ring includes a body having an annular circular shape and including a topside, a bottom side, and inner periphery and an outer periphery. The inner periphery has an inner diameter D1 and an inner circumference C1. The outer periphery has an outer diameter D2. The body includes a plurality of pads equally spaced around the inner periphery. Each of the plurality of pads extends radially inward a distance D5 from the inner periphery of the body. Each pad includes an inner edge. The inner edge of a first pad and an inner edge of a second pad located 180° from the first pad are spaced apart a distance D4 that is less than the inner diameter D1. The method further includes a step of elevating the workpiece towards the bottom side of the clamp ring, contacting the workpiece with a portion of the bottom side of the clamp ring making up no more than 25% of C1 and depositing a film onto the workpiece.

In accordance with another embodiment of a method in accordance with the present disclosure, contacting the workpiece with a portion of the bottom side of the clamp ring includes contacting the workpiece with a portion of the bottom side of the clamp ring making up no more than 5% of C1.

In another embodiment, a system is described for depositing a film on a workpiece. The system includes a vapor deposition chamber containing a clamp ring. The clamp ring includes a body having an annular circular shape and including a topside, a bottom side, inner periphery and an outer periphery. The inner periphery has an inner diameter D1 and the outer periphery has an outer diameter D2. A plurality of alignment marks are equally spaced around the inner periphery of the body. Each of the plurality of alignment marks extend radially inward from the inner periphery of the body. Each of the plurality of alignment marks includes an inner edge. The inner edge of a first alignment mark and the inner edge of a second alignment mark that is located 180° from the first alignment mark are spaced apart a distance D3. The clamp ring further includes a plurality of pads equally spaced around the inner periphery of the body of the clamp ring. Each of the plurality of pads extends radially inward a distance D5 from the inner periphery of the clamp ring body. Each of the plurality of pads includes an inner edge. The inner edge of a first pad and the inner edge of a second pad located 180° from the first pad are spaced apart a distance D4. In some embodiments, D1 satisfies the equation: $D4+2\times(D5+X \text{ mm})$, wherein in some embodiments X is greater than 0 mm and in other embodiments, X is greater than 0.3 mm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A clamp ring for use in a deposition chamber for depositing a film on a workpiece, the clamp ring comprising:
   a body, the body having an annular circular shape and including a top side, a bottom side, an inner periphery having an inner diameter D1 and an outer periphery having an outer diameter D2, the top side and the bottom side spaced along a first direction;
   a plurality of pads configured to contact the workpiece equally spaced around the inner periphery of the body, each of the plurality of pads extending radially inward a distance D5 from the inner periphery of the body and including an inner edge, the inner edge of a first pad and the inner edge of a second pad located 180 degrees from the first pad are spaced apart a distance D4 that is less than inner diameter D1; and
   a plurality of alignment marks, the plurality of alignment marks being closer to the top side than the plurality of pads in the first direction.

2. The clamp ring of claim 1, wherein the workpiece is round and has an outer diameter, D1 being at least 0.5% greater than the outer diameter of the workpiece.

3. The clamp ring of claim 1, wherein the plurality of alignment marks is equally spaced around the inner periphery of the body, each of the plurality of alignment marks extending radially inward from the inner periphery of the body and including an inner edge, the inner edge of a first alignment mark and the inner edge of a second alignment mark located 180 degrees from the first alignment mark are spaced apart a distance D3.

4. The clamp ring of claim 1, wherein the plurality of pads is six or more pads.

5. The clamp ring of claim 3, wherein the plurality of alignment marks is two or more.

6. The clamp ring of claim 1, wherein D1 satisfies the equation:

$D4+2\times(D5+X \text{ mm})$, wherein $X$ is greater than 0 mm.

7. The clamp ring of claim 6, wherein X is 0.3 mm or greater.

8. The clamp ring of claim 1, wherein the deposition chamber is a physical vapor deposition chamber.

9. The clamp ring of claim 3, wherein D3 is less than D1.

10. The clamp ring of claim 3, wherein D3 is less than D4.

11. A method of depositing a film onto a workpiece, the method comprising:
   providing a deposition chamber with a clamp ring including:
      a body, the body having an annular circular shape and including a top side, a bottom side, an inner periphery having an inner diameter D1 and an inner circumference C1, and an outer periphery having an outer diameter D2; and
      a plurality of pads equally spaced around the inner periphery of the body, each of the plurality of pads extending radially inward a distance D5 from the inner periphery of the body and including an inner edge, the inner edge of a first pad and the inner edge of a second pad located 180 degrees from the first pad spaced apart a distance D4 that is less than the inner diameter D1;
   elevating the workpiece towards the bottom side of the clamp ring;
   contacting the workpiece with the plurality of pads, wherein the inner periphery does not contact the workpiece, the plurality of pads making up no more than 25% of C1; and
   depositing a film onto the workpiece.

12. The method of claim 11, wherein the contacting includes contacting the workpiece with a portion of the bottom side of the clamp ring making up no more than 10% of C1.

13. The method of claim 12, wherein the contacting includes contacting the workpiece with a portion of the bottom side of the clamp ring making up no more than 5% of C1.

14. The method of claim 11, further comprising contacting the workpiece with one or more of the plurality of pads.

15. A system for depositing a film on a workpiece, the system comprising:
   a physical vapor deposition chamber;
   a clamp ring within the physical deposition vapor chamber, the clamp ring including a body, the body having an annular circular shape and including a top side, a bottom side, an inner periphery having an inner diameter D1 and an outer periphery having an outer diameter D2;
   a plurality of alignment marks equally spaced around the inner periphery of the body, each of the plurality of alignment marks extending radially inward from the inner periphery of the body and including an inner edge, the inner edge of a first alignment mark and the inner edge of a second alignment mark located 180 degrees from the first alignment mark are spaced apart a distance D3; and
   a plurality of pads configured to contact the workpiece and equally spaced around the inner periphery of the body, at least one of the plurality of pads being in contact with at least one of the plurality of alignment marks, each of the plurality of pads extending radially inward a distance D5 from the inner periphery of the body and including an inner edge, the inner edge of a first pad and the inner edge of a second pad located 180 degrees from the first pad and spaced apart a distance D4, wherein D1 satisfies the equation:

$D4+2\times(D5+X \text{ mm})$, wherein $X$ is greater than 0 mm.

16. The system of claim 15, wherein X is 0.3 mm or greater.

17. The system of claim 15, wherein the workpiece is round and has an outer diameter, D1 being at least 0.5% greater than the outer diameter of the workpiece.

18. The system of claim 15, wherein the plurality of pads is less than six.

19. The system of claim 15, wherein D3 is less than D1.

20. The system of claim 15, wherein D3 is less than D4.

* * * * *